(12) United States Patent
Chen

(10) Patent No.: US 7,618,155 B2
(45) Date of Patent: Nov. 17, 2009

(54) FLASHLIGHTS UTILIZING UNIQUE LED LIGHT SOURCES

(76) Inventor: Jeff Jianhua Chen, 345 N. Iowa St., Lawrence, KS (US) 66044

( * ) Notice: Subject to any disclaimer, the term of this patent is extended or adjusted under 35 U.S.C. 154(b) by 0 days.

(21) Appl. No.: 11/279,929

(22) Filed: Apr. 17, 2006

(65) Prior Publication Data

US 2007/0109775 A1 May 17, 2007

Related U.S. Application Data

(60) Provisional application No. 60/597,175, filed on Nov. 15, 2005.

(51) Int. Cl.
*F21Y 4/04* (2006.01)
(52) U.S. Cl. ............... 362/206; 362/189; 362/202
(58) Field of Classification Search ......... 362/202–206, 362/189
See application file for complete search history.

(56) References Cited

U.S. PATENT DOCUMENTS

| | | | | |
|---|---|---|---|---|
| 4,357,648 A * | 11/1982 | Nelson | ............... | 362/183 |
| 4,495,550 A * | 1/1985 | Visciano | ............... | 362/189 |
| 4,701,835 A * | 10/1987 | Campagnuolo et al. | ......... | 362/192 |
| 4,823,242 A * | 4/1989 | Maglica et al. | ............... | 362/187 |
| 5,043,854 A * | 8/1991 | Gammache | ............... | 362/197 |
| 5,588,739 A * | 12/1996 | Nakao | ............... | 362/205 |
| 5,632,551 A * | 5/1997 | Roney et al. | ............... | 362/485 |
| 6,199,997 B1 * | 3/2001 | Outsen et al. | ............... | 362/109 |
| 6,305,818 B1 * | 10/2001 | Lebens et al. | ............... | 362/184 |
| 6,402,339 B1 * | 6/2002 | Mukogawa et al. | ......... | 362/184 |
| RE38,014 E * | 3/2003 | Bieberstein | ............... | 362/206 |
| 6,737,811 B2 * | 5/2004 | Zhang et al. | ............... | 315/56 |
| 6,802,622 B2 * | 10/2004 | Hsien | ............... | 362/187 |
| 2003/0151915 A1 * | 8/2003 | Mele | ............... | 362/184 |
| 2004/0130894 A1 * | 7/2004 | Galli | ............... | 362/205 |
| 2005/0088843 A1 * | 4/2005 | Chapman | ............... | 362/184 |
| 2005/0157492 A1 * | 7/2005 | Chiu | ............... | 362/184 |
| 2006/0092629 A1 * | 5/2006 | Chen | ............... | 362/157 |

* cited by examiner

*Primary Examiner*—Jacob Y Choi
*Assistant Examiner*—Julie A Shallenberger
(74) *Attorney, Agent, or Firm*—Ash Tankha

(57) ABSTRACT

Seven thermally and optically efficient LED units and two control units are disclosed. Flashlights utilizing these LED units and control units are also disclosed. Such a flashlight mainly includes a cylindrical housing, a cylindrical rear cap, one of the seven LED units, one of the two control units. Each LED units are interchangeable between different emitting colors. Each LED unit mainly comprises a metal base, a reflector if the metal base is not a reflector itself, a leadframe formed attaching one or more metal pins to a printed circuit board, one or more LED dies mounted on the metal base, optical material disposed over the LED dies, and an optional lens to further focus the light.

9 Claims, 12 Drawing Sheets

_US 7,618,155 B2_

FLASHLIGHTS UTILIZING UNIQUE LED LIGHT SOURCES

This application claims the benefits of the U.S. provisional patent application: No. 60/597,175, filed on Nov. 15, 2005 and the U.S. utility patent application: Ser. No. 11/306,677, filed on Jan. 6, 2006.

This invention relates to seven types of optically and thermally efficient light emitting diode units (hereafter, LED units). More particularly, this invention relates to flashlights employing these LED units.

Prior art flashlights employing incandescent bulbs produce lights by electrically heating the filaments to glow. The filaments are fragile, especially when they are heated. In addition, this type of flashlights is very inefficient in energy consumption.

Prior art flashlights employing halogen and xenon lamps produce light more efficiently than the ones employing incandescent bulbs. However, the halogen and xenon lamps still have delicate filaments.

Prior art flashlights employing LED light sources are efficient in energy consumption, and are not subject to the disadvantages associated with the heating of filament. The LED light sources are typically one or more T1 ¾ LED lamps, or a Luxeon type LED.

The intensity of a LED flashlight employing single T1 ¾ LED lamp is too low. A LED flashlight employing multiple T1 ¾ LED lamps will be brighter. However, the flashlights must have large head to accommodate these T1 ¾ LED lamps. Moreover, the lights they generate cannot be well focused. A LED flashlight employing a Luxeon type LED is bright and can be well focused. However, the Luxeon type LED normally needs to be mounted on a secondary heat sink. In order to efficiently employ a Luxeon type LED to a flashlight, an additional heat sink, an additional reflector, and/or an additional focusing lens are necessary. Then the size of the lamp head is normally larger than 2 cm.

It is therefore an object of this invention to provide designs of thermally and optically efficient LED units. It is also an object of this invention to accordingly design flashlights that can most efficiently employ these LED units. The applications of these LED units are not limited to flashlights.

Each LED unit mainly includes one or more LED dies, a metal base, a leadframe embedded into the metal base, optical material disposed over the LED dies, a reflector and a lens. The LED dies are either welded or mounted on the metal base. The LED dies can be any color LED dies. The white lights may be produced from UV or blue LED dies coated with corresponding phosphors, or from the mixing of the emitting lights from blue, green and red LED dies. The metal base is a heat sink for the LED dies. A LED unit can be smaller than 1 cm in outer diameter. A flashlight employing one of the LED units further includes a metal cylindrical housing, a rear cap, a control unit, and a switch. The metal cylindrical housing electrically and thermally contacts the metal base. It also functions as the extended part of the heat sink. The cylindrical housing measures the smallest 0.96 cm in the outer diameter to accommodating AAAA batteries. The cylindrical housing can be other sizes to accommodate other batteries, such as AAA, AA, C, D, CR123 and CR2 size batteries, and etc. The control unit controls the on/off of the light, and at the same time limiting the driving current and suppressing the current surge. The switch can be designed as a pushbutton switch, or a twisting switch. The pushbutton switch turns the flashlight momentarily on by pressing down the pushbutton halfway, and turns the flashlight constantly on by pressing the pushbutton all the way down. The twisting switch turns off the flashlight by screwing the LED unit fully into the housing, and turns on the flashlight by screwing the LED unit a little away from the housing.

Figure 1:
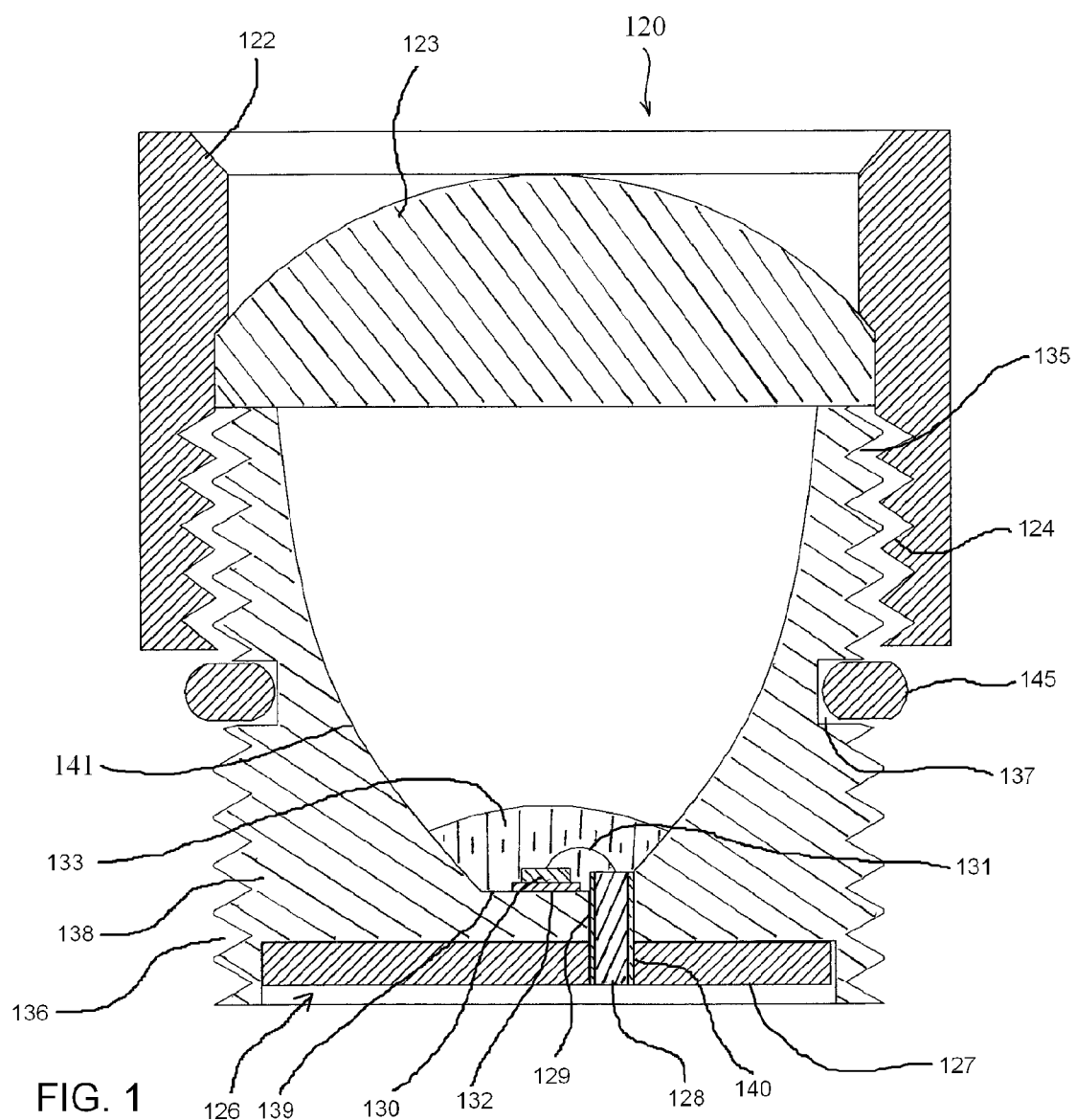
FIG. 1, FIG. 2, FIG. 3, FIG. 4, FIG. 5, FIG. 6 and FIG. 7 are the cross-sectional views of the thermally and optically efficient LED unit.

In the drawings, when an element or feature is shown in more than one figure, the same alphanumeric designation is used to designate such an element or feature in each figure.

FIG. 1 is a side cross-sectional view of the LED unit 120. The metal base 138 has one end engaged in the lens frame 122, another end to be engaged in a flashlight body. The metal base 138 preferably has external threads on both ends. The outer shape of the metal base 138 is not limited to the shape shown in FIG. 1. The inner surface 141 of the metal base 138 is reflective. The inner surface 141 can take on any shape, but is preferably parabolic as shown in FIG. 1. The inner surface 141 has a flat portion 139 at the bottom. One or more LED dies 130 are either welded or mounted on the portion 139 via a thermally conductive adhesive layer. The LED dies 130 are preferably located at the focal point of the reflective inner surface 141. The metal base 138 has one or more circular holes 140, through which one or more metal pins 128 project out. The metal pins 128 and the printed circuit board 127 form the leadframe 126. The printed circuit board 127 is adhered to the metal base 138. The metal pins 128 are electrically isolated from the metal base 138 via the insulating layers 129. The LED dies 130 are electrically connected to the metal pin 128 through gold wires 131. Optical material 133 is disposed onto the LED dies 130. The lens 123 coupled into the lens frame 122 is connected, preferably permanently fixed, to the metal base 138. The lens 123 is preferable glass, but is not limited to glass. The metal base 138 has a circumferential groove 137 to receive the resilient O-ring 145. The resilient O-ring 145 is to provide a water-resistant seal between the LED unit 120 and a flashlight body.

Figure 2:
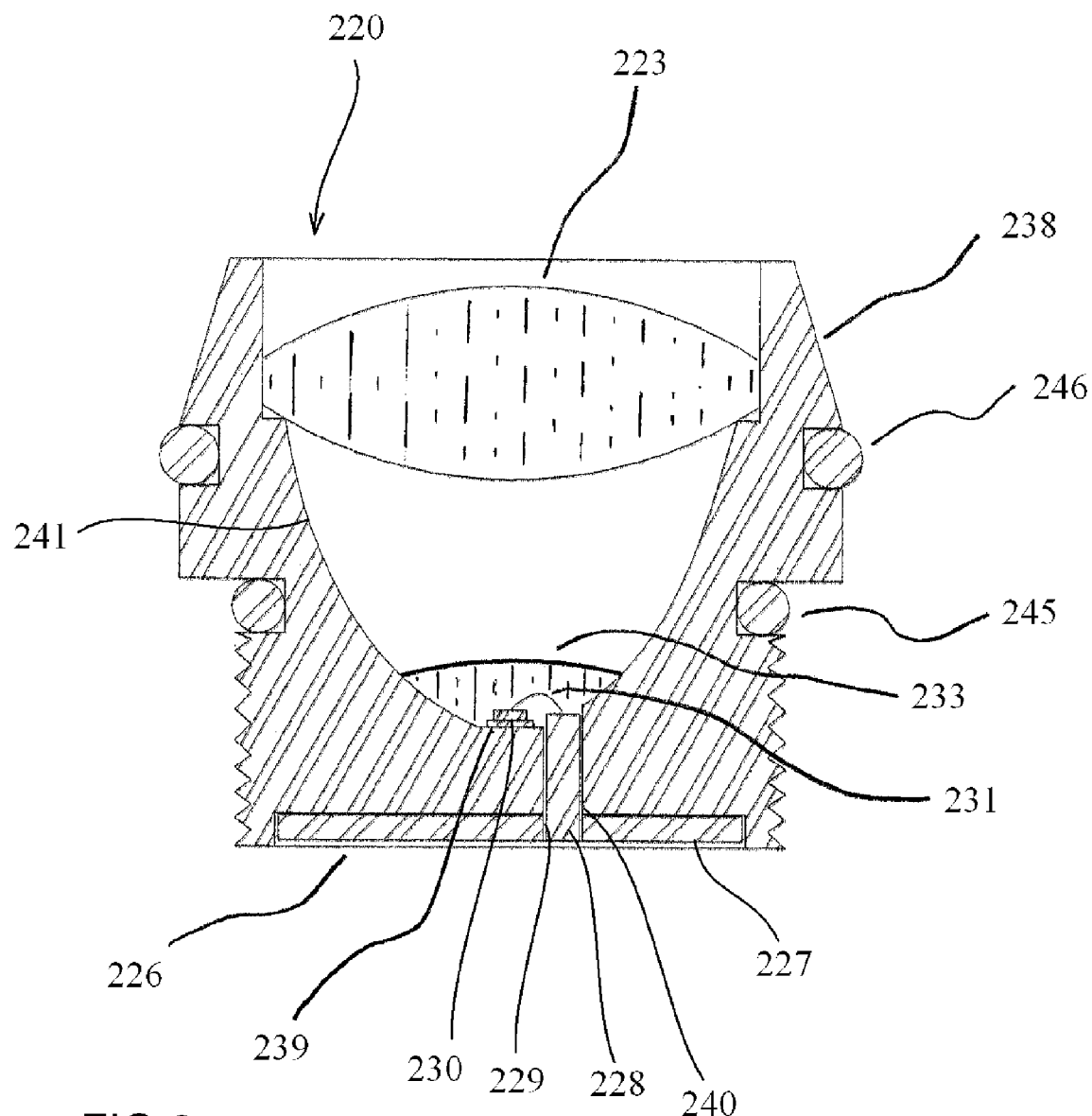

FIG. 2 is a side cross-sectional view of the LED unit 220. The metal base 238 has one end where a lens is to be adhered. The other end is to be engaged into a flashlight body, and is preferably threadedly engaged in the flashlight body. The outer shape of the metal base 238 is not limited to the shape shown in FIG. 2. The inner surface 241 of the metal base 238 is reflective. The inner surface 241 can take on any shape, but is preferably parabolic as shown in FIG. 2. The metal base 238 has a flat portion 239 at the bottom. One or more LED dies 230 are either welded or mounted on the portion 239 via a thermally conductive adhesive layer. The LED dies 230 are preferably located at the focal point of the reflective inner surface 241. The metal base 238 has one or more circular holes 240, through which one or more metal pins 228 project out. The metal pins 228 are soldered onto the printed circuit board 227 to form the leadframe 226. The printed circuit board 227 is adhered to the metal base 238. The metal pins 228 are electrically isolated from the metal base 238 via the insulating layers 229. The LED dies 230 are electrically connected to the metal pin 228 through gold wires 231. Optical material 233 is disposed onto the LED dies 230. The lens 223 is fixed onto the metal base 238. The lens 223 is preferable glass, but is not limited to glass. The resilient O-ring 245 is to provide a water-resistant seal between the LED unit 220 and a flashlight body. The resilient O-ring 246 indicates the color of the emitted light from the LED unit 220 and provides additional friction so that the LED unit is not too slippery.

Figure 3:
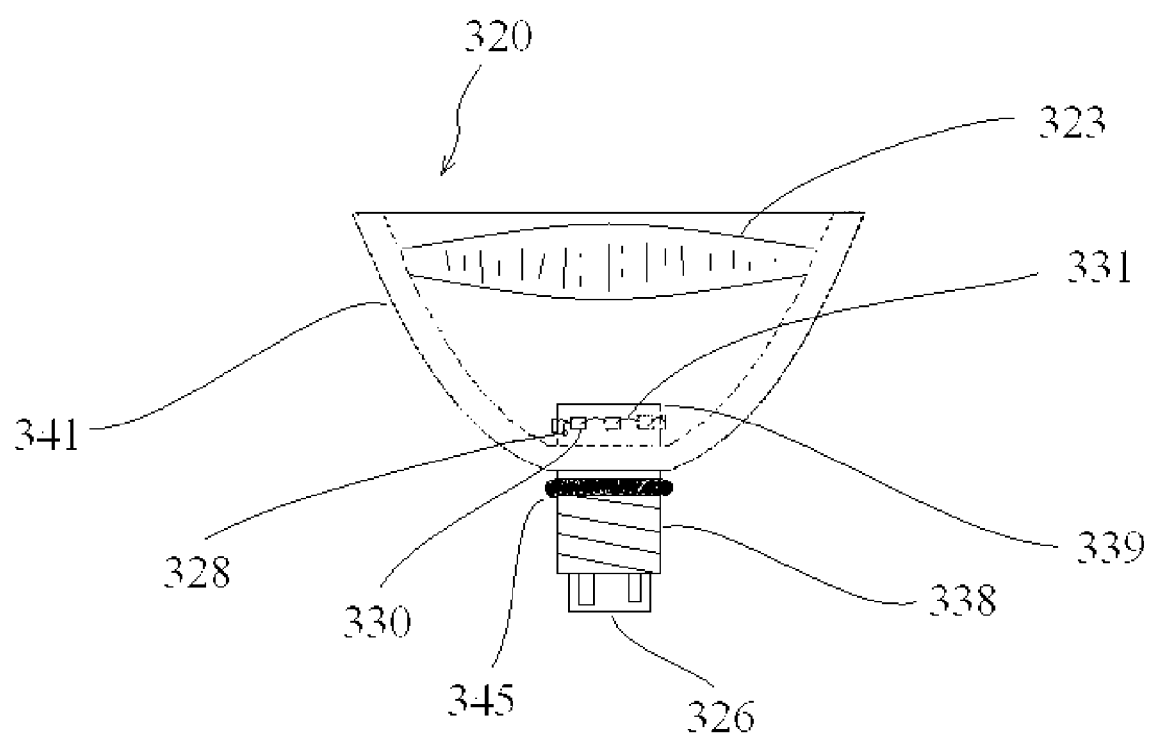

FIG. 3 is a side view of the LED unit 320. The metal ring 338 has a reflective portion 339 at one end. LED dies 330 are either evenly welded, or evenly mounted on the reflective portion 339 via a thermally conductive adhesive layer. LED dies 330 are interconnected through the gold wires 331 in a combination of both serial and parallel. The LED dies 330 and the gold wires 331 are protected by optical material. The reflector 341 is connected to the metal ring 338, and is preferably threadedly connected onto the metal ring 338. The reflector 341 can be metal or plastic coated with a highly reflective layer. The inner surface of the reflector 341 is preferably formed by rotating a parabolic curve for 360 degrees, so that each LED die can be located at the focal point of the reflector 341. The metal ring 338 is to be engaged, preferably threadedly engaged into a flashlight body. The metal ring 338 has two or more circular holes, through which two or more metal pins 328 project out. The metal pins 328 are soldered onto a printed circuit board to form a leadframe 326. The printed circuit board is located inside the metal ring 338. The metal pins 328 are electrically isolated from the metal ring 338 via insulating layers. The LED dies 330 are electrically connected to the metal pin 328 through gold wires 331. The lens 323 is fixed onto the reflector 341. The lens 323 is preferable glass, but is not limited to glass. The resilient O-ring 345 is to provide a water-resistant seal between the LED unit 320 and a flashlight body.

Figure 4:
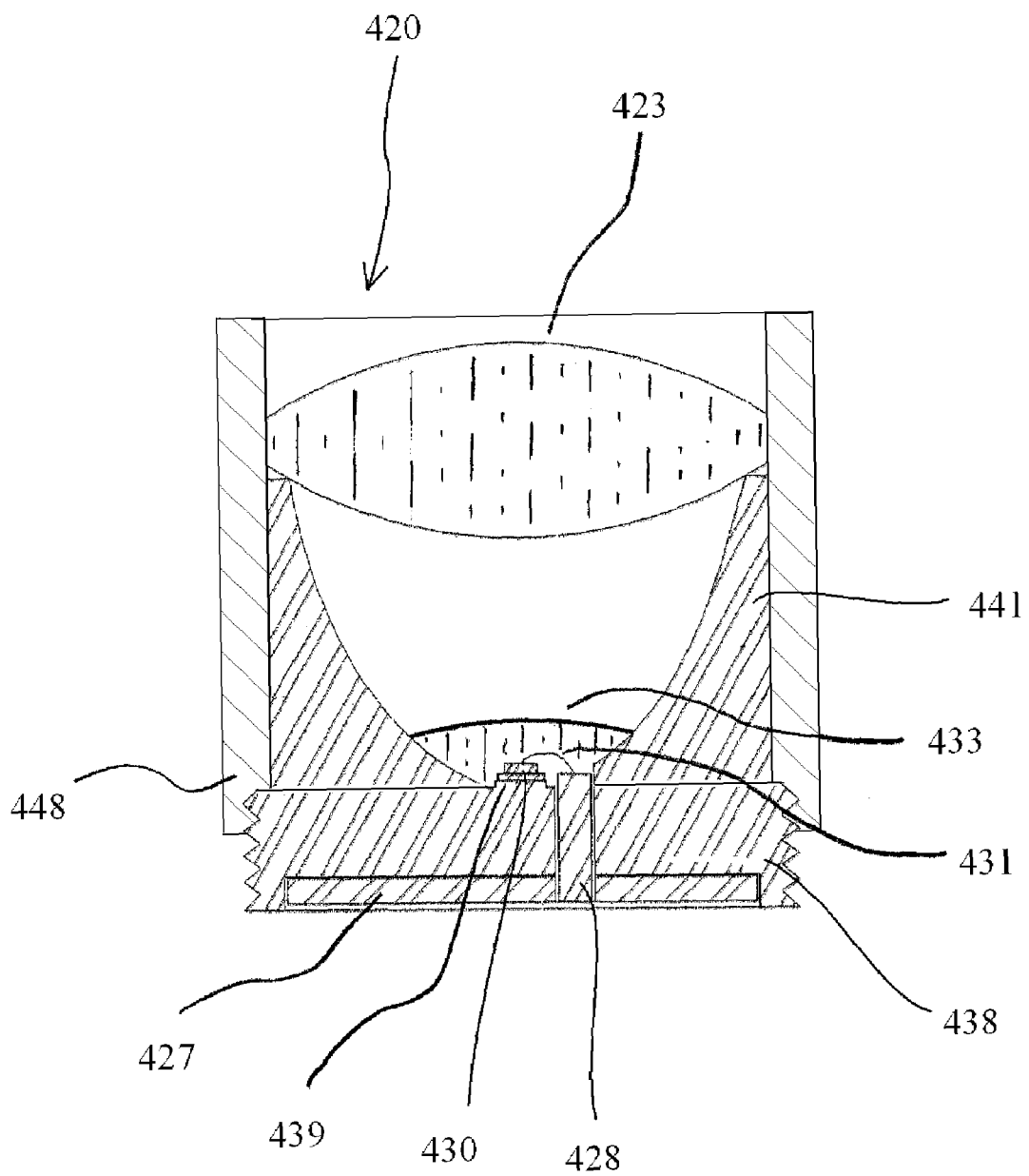

FIG. 4 is a side cross-sectional view of the LED unit 420. The metal base 438 has one end to be engaged into a flashlight body, and is preferably threadedly engaged in the flashlight body. The metal base 438 may have a raised flat portion 439. One or more LED dies 430 are either welded or mounted on the portion 439 via a thermally conductive adhesive layer. The reflector 441 is connected to the metal base 438, and is preferably adhered to the metal base 438. The reflector 441 can be metal or plastic coated with a highly reflective layer. The LED dies 430 are preferably located at the focal point of the reflector 441. The metal base 438 has one or more circular holes, through which one or more metal pins 428 project out. The metal pins 428 are soldered onto the printed circuit board 427 to form a leadframe. The printed circuit board 427 is adhered to the metal base 438. The metal pins 428 are electrically isolated from the metal base 438 via insulating layers. The LED dies 430 are electrically connected to the metal pin 428 through gold wires 431. Optical material 433 is disposed onto the LED dies 430. The metal frame 448 is connected to the metal base. The lens 423 is fixed onto the metal frame 448. The lens 423 is preferable glass, but is not limited to glass.

Figure 5:
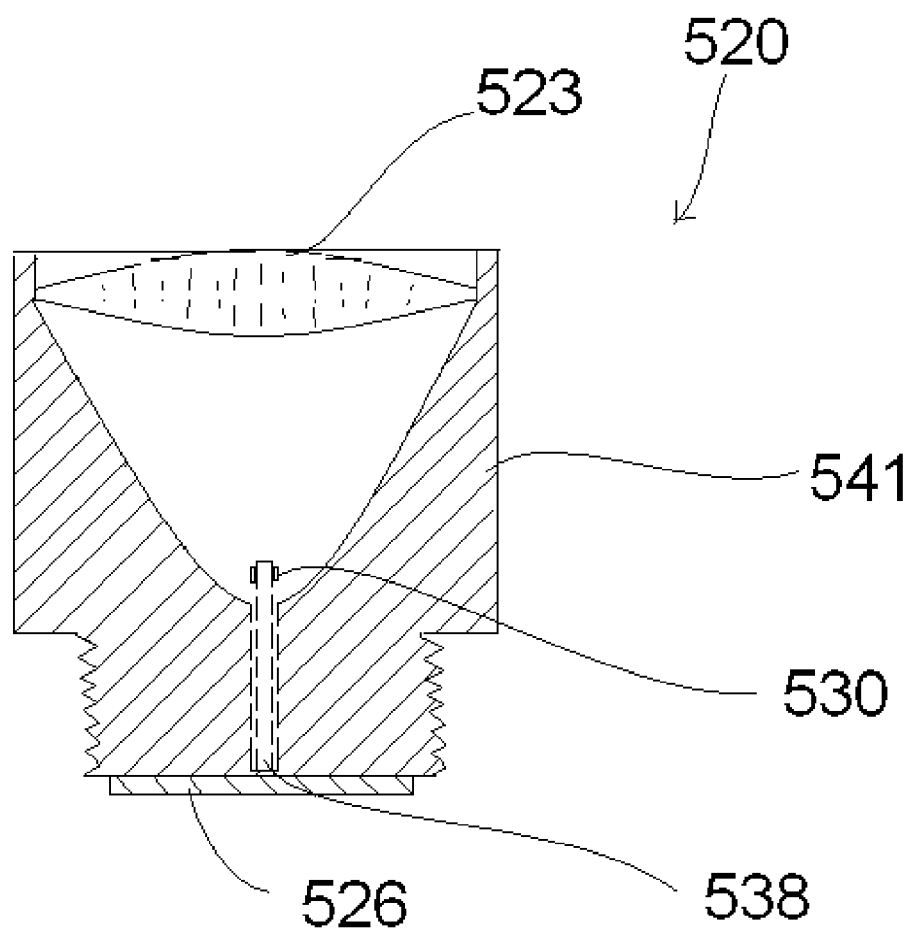

FIG. 5 is a side cross-sectional view of the LED unit 520. The thin base 538 is a metal bar or metal core PCB. The base 538 mechanically contacts the reflector 541. The LED dies 530 are symmetrically welded or mounted in the center of the edge on both sides of the base 538. Optical material 533 is disposed onto the LED dies 530. The leadframe 526 is formed by soldering wires onto a printed circuit board. The LED dies 530 are electrically connected to the leadframe 526. The reflector 541 has one end where a lens is to be adhered. The other end is to be engaged into a flashlight body, and is preferably threadedly engaged in the flashlight body. The outer shape of the reflector 541 is not limited to the shape shown in FIG. 5. The inner reflective surface of the reflector 541 is preferably parabolic as shown in FIG. 5, but is not limited to be parabolic. The LED dies 530 are preferably located at the focal point of the reflector 541. The lens 523 is fixed onto the reflector 541. The lens 523 is preferable glass, but is not limited to glass.

Figure 6:
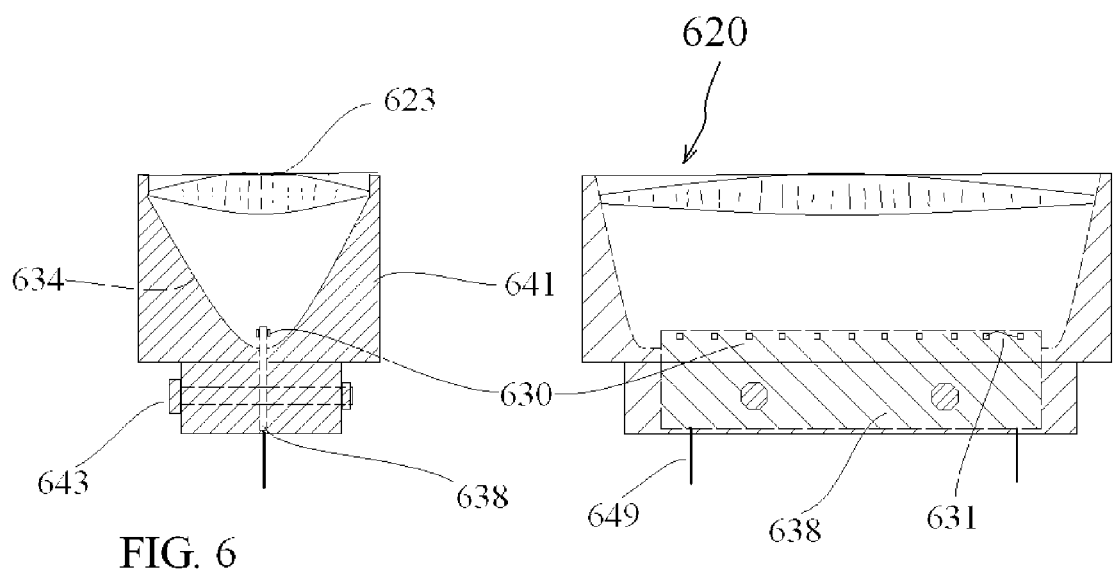

FIG. 6 is a side view of the LED unit 620. The thin base 638 is a metal bar or metal core PCB. The thin base 638 mechanically contacts the reflector 641, preferably via the metal screws 643. Two or more LED dies 630 are evenly welded or mounted along the edge on both sides of the thin base 638, as shown in FIG. 6. The LED dies 630 are interconnected through the gold wires 631 in a combination of both serial and parallel. The LED dies 630 are electrically connected to the pins 649 through gold wires 631. The LED dies 630 and the gold wires 631 are protected by optical material. The reflector 641 has one end where the lens 623 is to be adhered. The other end is to be connected with a flashlight body, preferably through a flexible metal tube. The outer shape of the reflector 641 is not limited to the shape shown in FIG. 6. The inner reflective surface 634 of the reflector 641 is preferably formed by extruding a parabolic curve in one direction, so that each LED die is located at the focal points of the reflector 641. The reflective surface of the reflector 641 is not limited to be formed by extruding a parabolic curve. The lens 623 is fixed onto the reflector 641. The lens 623 is preferable glass, but is not limited to glass.

Figure 7:
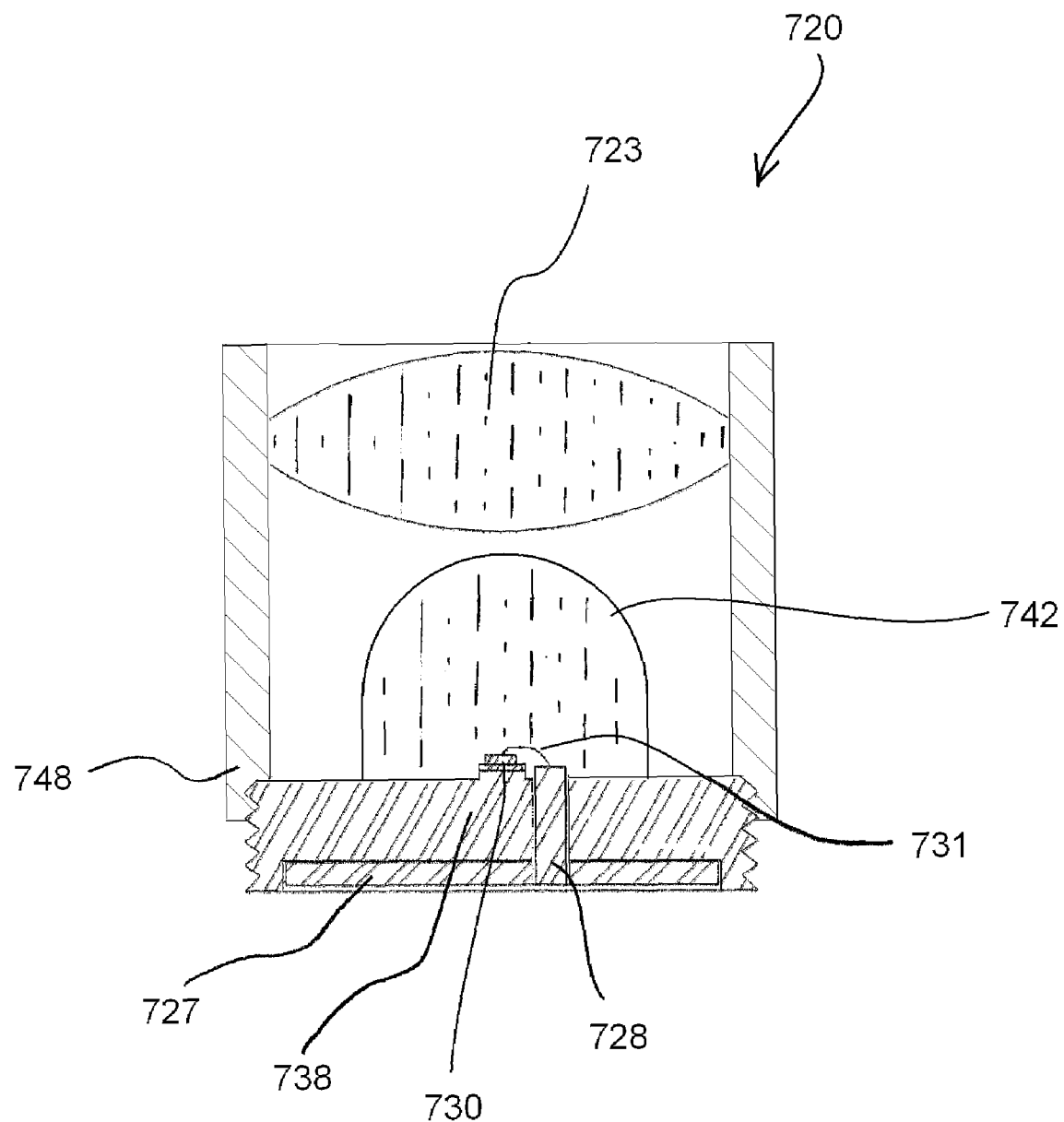

FIG. 7 is a side cross-sectional view of the LED unit 720. The metal base 738 has one end to be engaged into a flashlight body, and is preferably threadedly engaged in the flashlight body. One or more LED dies 730 are either welded or mounted on the metal base 738 via a thermally conductive adhesive layer. The LED dies 730 are encapsulated by the dome-shaped optical lens 742, and are preferably located at the focal point of the optical lens 742. The metal base 738 has one or more circular holes 740, through which one or more metal pins 728 project out. The metal pins 728 are soldered onto the printed circuit board 727 to form a leadframe. The printed circuit board 727 is adhered to the metal base 738. The metal pins 728 are electrically isolated from the metal base 738 via insulating layers. The LED dies 730 are electrically connected to the metal pin 728 through gold wires 731. The metal frame 748 is connected to the metal base 738, and is preferably threadedly connected to the metal base 738. The lens 723 is fixed onto the metal frame 748. The lens 723 is preferable glass, but is not limited to glass.

Figure 8:
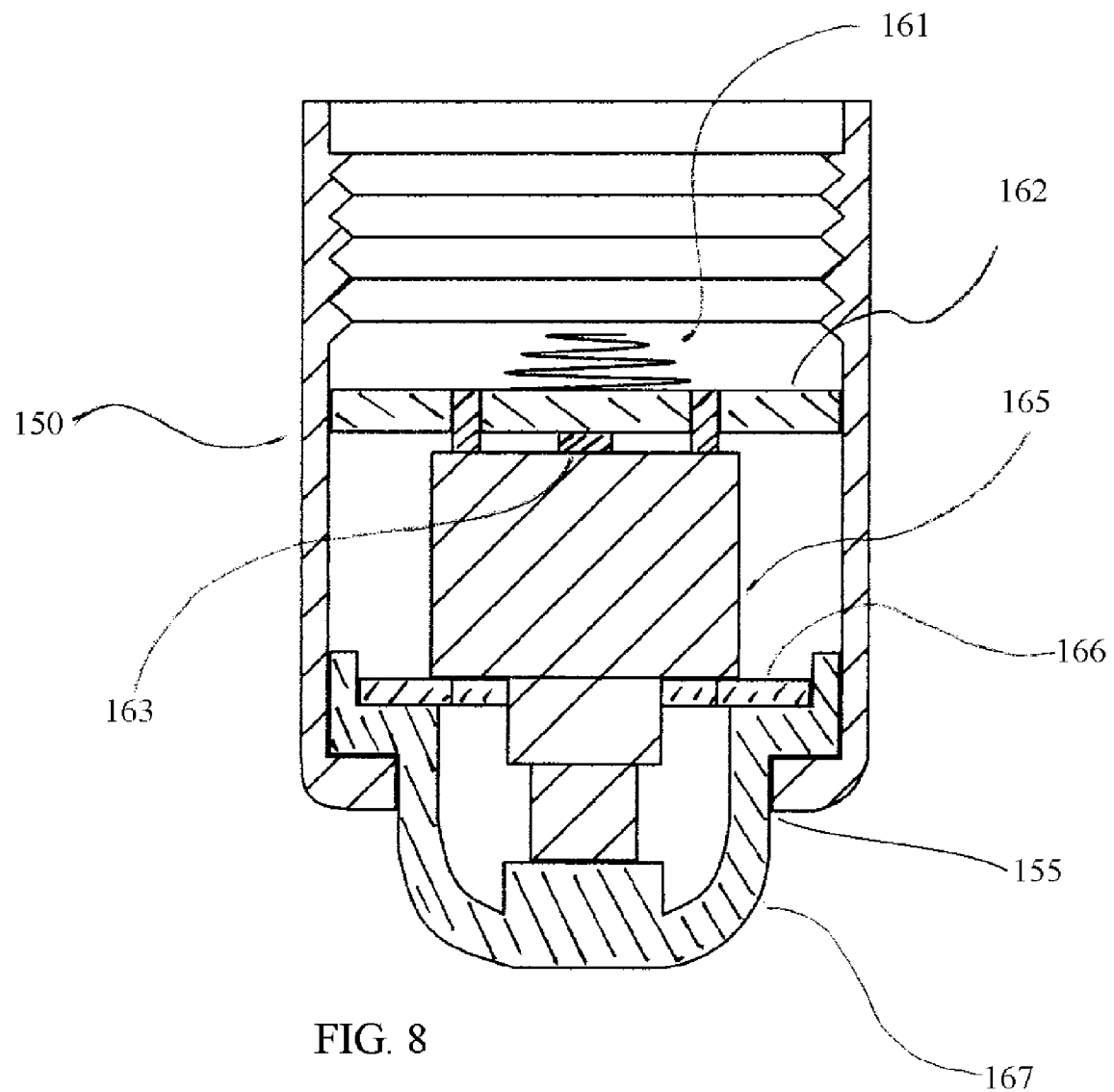
FIG. 8 is the side cross-sectional view of the assembled control unit and rear cap for a pushbutton switch.

FIG. 8 is the side cross-sectional view of the assembled control unit 160 and rear cap 150 for a pushbutton switch. The control unit 160 includes a spring 161, a printed circuit board 162, a surface mount resister 163, a switch 165, a washer 166 and a rubber cap 167. The spring 161 is soldered on one side of the printed circuit board 162. The resistor 163 and the switch 165 are soldered on the other side of the printed circuit board 162. The resistor 163 is to limit the driving current and suppress current surge. The cap 167 projects out of the circular hole 155. The rubber cap 167 is adhered to the rear cap for water resistant purpose.

Figure 9:
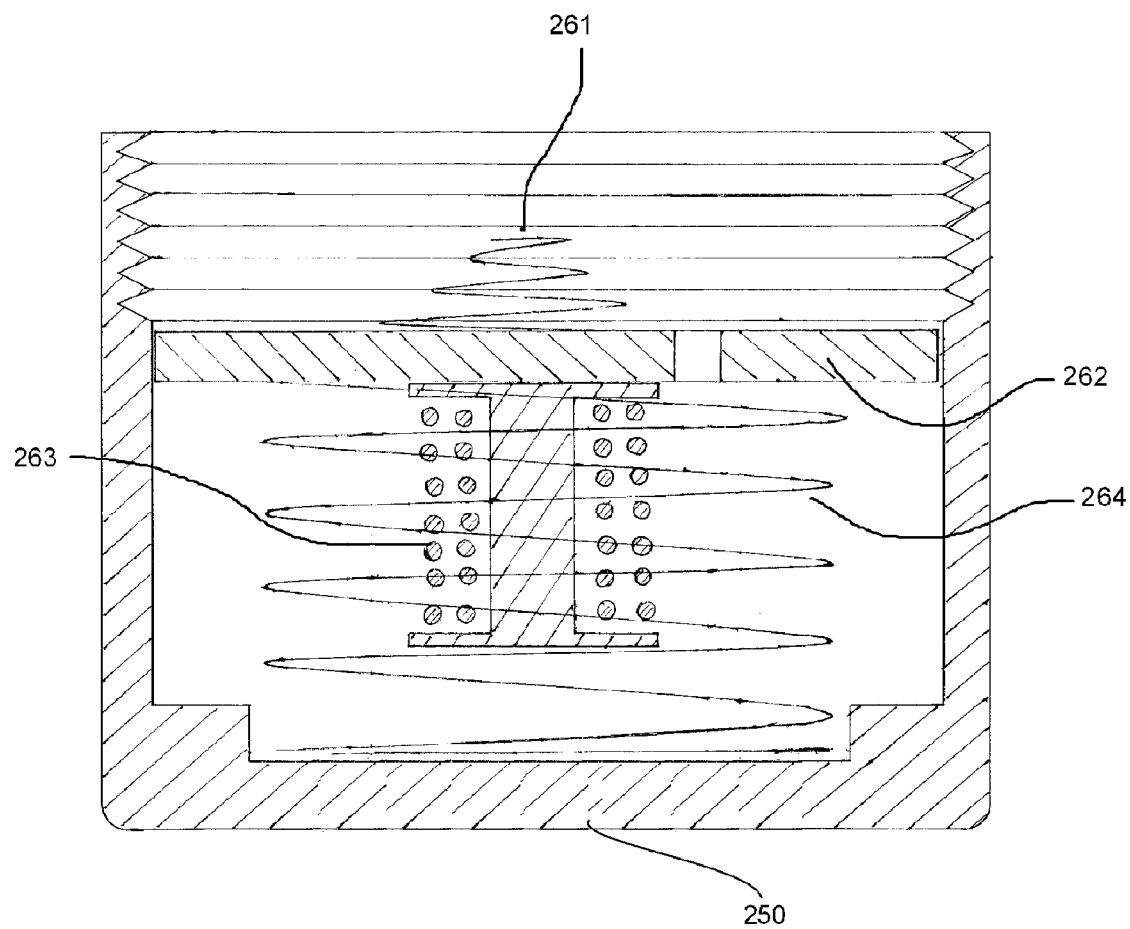
FIG. 9 is the side cross-sectional view of the assembled control unit and rear cap for a twisting switch.

FIG. 9 is the side cross-sectional view of the assembled control unit 260 and rear cap 250 for a twisting switch. The control unit 260 includes two springs 261 and 264, a printed circuit board 262 and an inductor 263. The spring 261 is soldered on one side of the printed circuit board 262. The inductor 263 is soldered on the other side of the printed circuit board 262. The spring 264 fits between the printed circuit board 262 and the rear cap 250.

Figure 10:
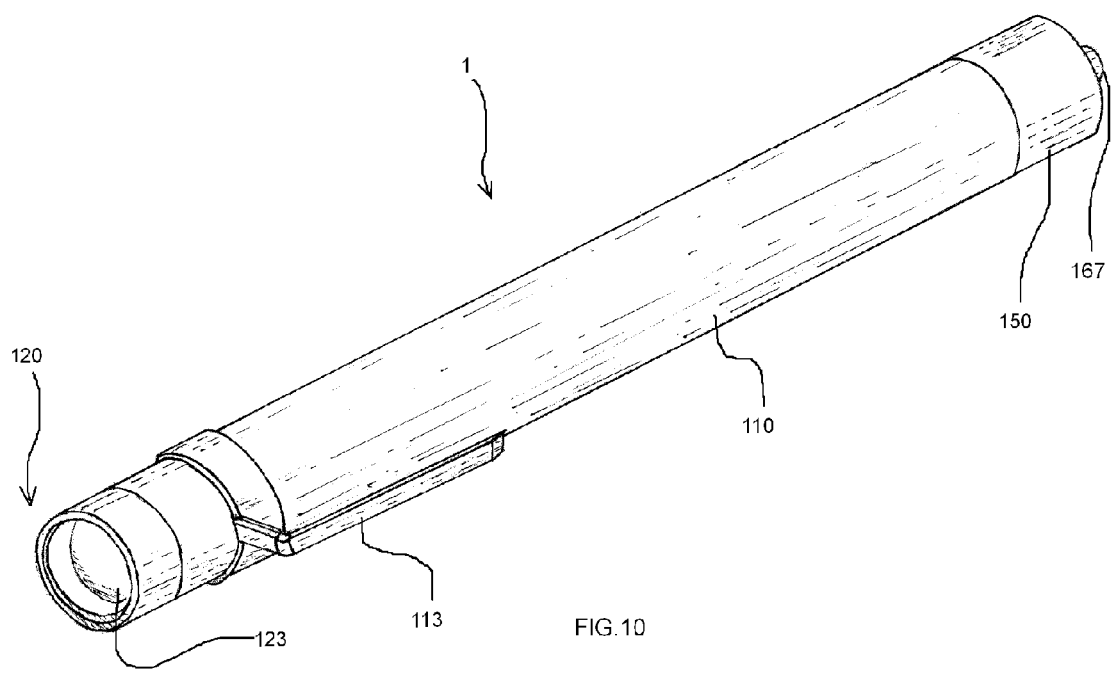
FIG. 10 illustrates one flashlight employing the LED unit in FIG. 1 and the pushbutton switch in FIG. 8.
Figure 11:
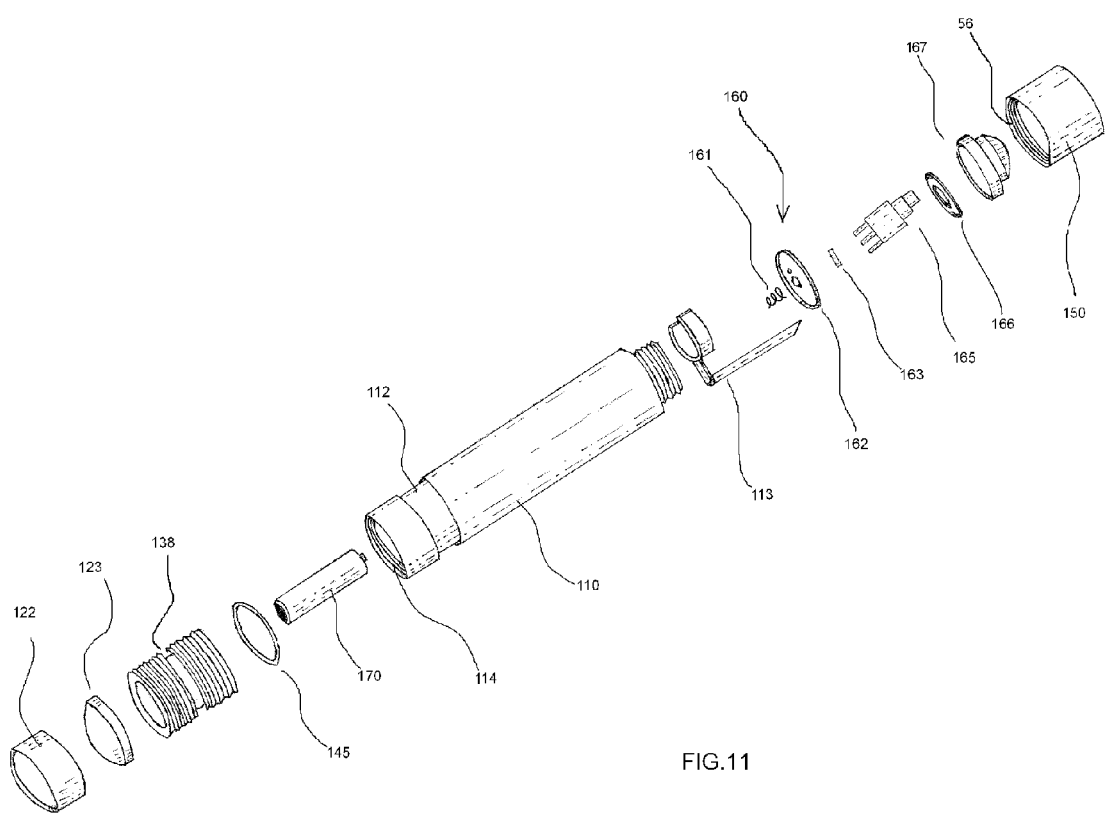
FIG. 11 is an exploded perspective view of the flashlight in FIG. 10.

FIG. 10 illustrates a flashlight employing the LED unit in FIG. 1 and the pushbutton switch in FIG. 8; FIG. 11 is an exploded perspective view of the flashlight in FIG. 10, illustrating the external and internal components. The flashlight 1 includes the LED unit 120, the cylindrical housing 110, the rear cap 150, the control unit 160, and the rubber cap 167. The rear cap 150 has a circular hole 155 through which the control unit 160 projects in a rearward direction. The rubber cap 167 is adhered to the rear cap for water resistant purpose. The pocket-clip 113 is located either under the rear cap 150 or under the LED unit 120. The LED unit 120 is preferably copper. The housing 110 and the rear cap 150 can be any metal, however are preferably lightweight aluminum with anodized finish. The anodized finish is removed at locations where electrical connection is to be made. A copper ring 114 is optionally embedded into the housing 110 for more durable contact with the LED unit 120. The resilient O-ring 145 is to provide water-resistant seal between the LED unit 120 and the housing 110. The rear cap 150 is fixed onto the cylindrical housing 110, forming physical contact. Internal components inside the hollow cylindrical housing 110 include two or more batteries 170. The batteries are connected in series to provide a source of electrical energy for energizing the LED unit 120. When the switch is pressed halfway down, the flashlight 1 is momentarily on. When the switch is fully pressed down, the electrical circuit to light up the power LED unit 220 is completed. The LED unit 120 is interchangeable between the emitting colors of UV, blue, green, white, yellow, red and IR, and has extremely long expected lifetimes, e.g., 100,000 hours.

Figure 12:
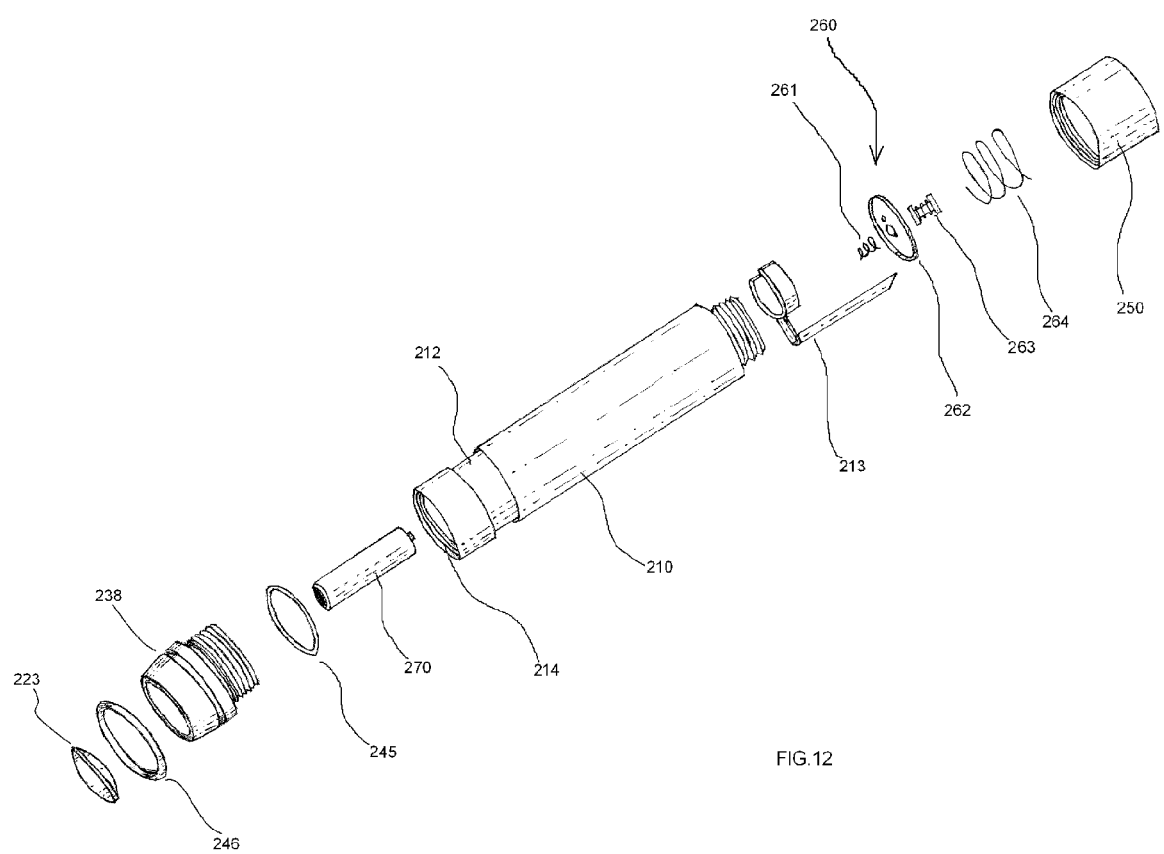
FIG. 12 is the perspective view of another flashlight employing the LED unit in FIG. 2 and the twisting switch in FIG. 9.

FIG. 12 is an exploded perspective view of another flashlight employing the LED unit in FIG. 2 and the twisting switch in FIG. 9. The flashlight 2 includes the LED unit 220, the cylindrical housing 210, the rear cap 250 and the control unit 260. The cylindrical housing 210 has a portion 212 to receive a pocket-clip 213. The housing 210 and the rear cap 250 can be any metal, however are preferably lightweight aluminum with anodized finish. The anodized finish is removed at locations where electrical connection is to be made. The threaded copper ring 214 is optionally embedded into one end of the housing 210 for more durable contact with the LED unit 220. The rear cap 250 is fixed onto the cylindrical housing 210, forming physical contact, but not electrical contact. Internal components that slip inside the hollow cylindrical housing 210 include two or more batteries 270. The batteries are connected in series to provide a source of electrical energy for energizing the LED unit 220. When the LED unit 220 is fully screwed into the housing 210, it is in electrical contact with the housing 210, and the batteries are in contact with the control unit 260, however, the control unit 260 is separated from the housing 210, breaking the electrical connection between the batteries 270 and the power LED unit 220. When the LED unit 220 is screwed away from the housing 210 until the control unit 260 is in electrical contact with both the batteries 270 and the housing 210, an electrical circuit to light up the power LED unit 220 is completed. The LED unit 220 is interchangeable between the emitting colors of UV, blue, green, white, yellow, red, IR, etc., and has extremely long expected lifetimes, e.g., 100,000 hours.

Other flashlights can be made by combining one of the seven LED units, one of the two switches, and other additional parts similar to Flashlight 1 and Flashlight 2.

What is claimed is:

1. A flashlight comprising:
   a light emitting diode (LED) unit, comprising:
      a metal base having a first end and a second end, wherein said first end internally tapers towards bottom of said metal base to form a reflective inner surface comprising a flat portion;
      a metal core printed circuit board (PCB) mounted on said flat portion of the metal base, wherein one or more LED dies are conductively mounted on both sides of said metal core PCB by one of welding and adhering, and wherein the one or more LED dies are interconnected using one or more wires;
      one or more metal screws inserted through one or more recesses around outer periphery of the metal base for establishing a contact between the metal core PCB and the metal base, wherein the metal base absorbs and dissipates heat produced by the LED dies;
      a lens mounted on the first end of the metal base in front of the reflective inner surface; and
      a printed circuit board (PCB) attached to said second end of the metal base for providing a first electrical connection to the one or more LED dies through said one or more wires, wherein the one or more wires are connected to one or more metal pins inserted through one or more insulated openings in the metal base, and wherein said metal pins form a leadframe on top of said PCB;
   a cylindrical housing for accommodating one or more batteries, wherein said cylindrical housing comprises a first opening and a second opening, and wherein the cylindrical housing is attached to the second end of the metal base through said first opening;
   said batteries for providing electrical power to the one or more LED dies, wherein said batteries are in electrical communication to provide a first terminal and a second terminal, and wherein said first terminal is connected to said first electrical connection of the PCB; and
   an end cap attached to the cylindrical housing through said second opening for holding a control unit, wherein said control unit establishes a second electrical connection between the one or more LED dies and said second terminal through the cylindrical housing, the metal base, the one or more metal screws, and the metal core PCB.

2. The flashlight of claim 1, wherein said control unit comprises a spring, a resistor, and a switch mounted on a second printed circuit board, a washer, and a rubber cap.

3. The flashlight of claim 2, wherein said second printed circuit board electrically contacts the cylindrical housing and the second terminal of the batteries to establish said second electrical connection.

4. The flashlight of claim 1, wherein said control unit comprises a second printed circuit board, an inductor mounted on said second printed circuit board, and one or more springs attached to both sides of said second printed circuit board, wherein said springs are in contact with said end cap.

5. The flashlight of claim 4, wherein said second electrical connection is established between the cylindrical housing and the second terminal through said springs by twisting the end cap in a first direction, wherein twisting the end cap in a direction opposite to said first direction disconnects said established connection.

6. The flashlight of claim 1, wherein the lens is coupled to a lens frame connected to the metal base.

7. The flashlight of claim 1, wherein the lens is adhesively affixed to the metal base.

8. The flashlight of claim 1, wherein an optical material is disposed over the LED dies and the wires, and wherein said optical material protects the LED dies and the wires.

9. The flashlight of claim 1, wherein the cylindrical housing is attached to the metal base through a flexible metal tube.

* * * * *